US012751281B2

(12) United States Patent
Shin et al.

(10) Patent No.: US 12,751,281 B2
(45) Date of Patent: Sep. 29, 2026

(54) INTERCONNECT STRUCTURE AND ELECTRONIC DEVICE INCLUDING THE SAME

(71) Applicant: Samsung Electronics Co., Ltd., Suwon-si (KR)

(72) Inventors: Keunwook Shin, Yongin-si (KR); Sangwon Kim, Seoul (KR); Kyung-Eun Byun, Seongnam-si (KR); Joungeun Yoo, Seongnam-si (KR); Eunkyu Lee, Yongin-si (KR); Changseok Lee, Gwacheon-si (KR); Alum Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 568 days.

(21) Appl. No.: 18/158,233

(22) Filed: Jan. 23, 2023

(65) Prior Publication Data

US 2023/0238329 A1 Jul. 27, 2023

(30) Foreign Application Priority Data

Jan. 26, 2022 (KR) ........................ 10-2022-0011788

(51) Int. Cl.
*H10W 20/44* (2026.01)
*H10W 20/43* (2026.01)

(52) U.S. Cl.
CPC ....... *H10W 20/4462* (2026.01); *H10W 20/43* (2026.01); *H10W 20/4405* (2026.01); *H10W 20/4421* (2026.01); *H10W 20/4432* (2026.01); *H10W 20/4441* (2026.01)

(58) Field of Classification Search
None
See application file for complete search history.

(56) References Cited

U.S. PATENT DOCUMENTS

| | | | |
|---|---|---|---|
| 8,476,765 B2 | 7/2013 | Zhang et al. | |
| 8,541,769 B2 | 9/2013 | Chu et al. | |
| 9,482,960 B2 | 11/2016 | Yakunin et al. | |
| 10,090,386 B2 | 10/2018 | Lee et al. | |
| 10,312,329 B2 | 6/2019 | Zhou | |
| 2014/0319685 A1 | 10/2014 | Bao et al. | |
| 2019/0348466 A1 | 11/2019 | Pillarisetty et al. | |
| 2020/0035602 A1 | 1/2020 | Nam et al. | |
| 2020/0035611 A1* | 1/2020 | Byun | H01L 23/53238 |

(Continued)

FOREIGN PATENT DOCUMENTS

| | | |
|---|---|---|
| JP | 6225596 B2 | 11/2017 |
| KR | 10-2020-0011197 A | 2/2020 |

(Continued)

OTHER PUBLICATIONS

Korean Office Action dated Jul. 31, 2025 for corresponding Korean Patent Application No. 10-2022-0011788 and its English language translation.

*Primary Examiner* — Dale E Page
*Assistant Examiner* — Patrick Cullen
(74) *Attorney, Agent, or Firm* — Harness, Dickey & Pierce, P.L.C.

(57) ABSTRACT

An interconnect structure may include a dielectric layer including a trench, a conductive wiring including graphene filling an inside of the trench, and a liner layer in contact with at least one surface of the conductive wiring and including a metal.

18 Claims, 11 Drawing Sheets

(56) References Cited

U.S. PATENT DOCUMENTS

| | | | | |
|---|---|---|---|---|
| 2020/0243383 | A1* | 7/2020 | Huang | H01L 23/53252 |
| 2020/0350252 | A1 | 11/2020 | Shin et al. | |
| 2021/0305161 | A1* | 9/2021 | Chandrasekhar | H01L 23/53266 |
| 2023/0079680 | A1 | 3/2023 | Shin et al. | |
| 2023/0130702 | A1 | 4/2023 | Shin et al. | |

FOREIGN PATENT DOCUMENTS

| | | | |
|---|---|---|---|
| KR | 10-2020-0012237 | A | 2/2020 |
| KR | 10-2020-0126925 | A | 11/2020 |
| KR | 10-2021-0007367 | A | 1/2021 |
| KR | 10-2216543 | B1 | 2/2021 |

* cited by examiner

INTERCONNECT STRUCTURE AND ELECTRONIC DEVICE INCLUDING THE SAME

CROSS-REFERENCE TO RELATED APPLICATION

This application is based on and claims priority under 35 U.S.C. §119 to Korean Patent Application No. 10-2022-0011788, filed on Jan. 26, 2022 in the Korean Intellectual Property Office, the disclosure of which is incorporated by reference herein in its entirety.

BACKGROUND

1. Field

The present disclosure relates to an interconnect structure and an electronic device including the interconnect structure, and more particularly, to an interconnect structure having a low specific resistance by including a liner layer and an electronic device including the interconnect structure.

2. Description of the Related Art

In recent years, there has been a tendency of gradually reducing the size of semiconductor devices for high integration of the semiconductor devices, and as the size of the semiconductor device decreases, a line width of metal wirings also decreases. When the line width of a metal wiring is reduced, the specific resistance may increase exponentially, and the reliability may decrease due to heat generation or the like.

In order to overcome the low reliability of a nanoscale metal wiring, research on conductive wiring including graphene has been conducted. Graphene is a material having a hexagonal honeycomb structure in which carbon atoms are two-dimensionally connected, and has a very small thickness at an atomic size level. Graphene has advantages of high electrical mobility, excellent thermal properties, chemical stability, and a large surface area.

However, when a conductive wiring including graphene is formed under a low-temperature process at 400° C. or less, the specific resistance of the conductive wiring may be increased to 1000 μΩ·cm or more. A conductive wiring having a large specific resistance of 1000 μΩ·cm or more may not be suitable for application to an electronic device. Accordingly, it may be necessary for a conductive wiring to have a sufficiently low specific resistance so that the conductive wiring including graphene may be applied to an electronic device even under a low-temperature process.

SUMMARY

Provided are interconnect structures including a liner layer provided in contact with at least one surface of a conductive wiring and electronic devices including the interconnect structure.

Additional aspects will be set forth in part in the description which follows and, in part, will be apparent from the description, or may be learned by practice of the presented embodiments of the disclosure.

According to an embodiment, an interconnect structure may include a dielectric layer including a trench; a conductive wiring filling an inside of the trench, the conductive wiring including graphene; and a liner layer contacting at least one surface of the conductive wiring, the liner layer including a metal.

In some embodiments, the graphene may include intrinsic graphene or nanocrystalline graphene.

In some embodiments, the graphene may have a bonding structure in which a ratio of carbon having a $sp^2$ bonding structure total carbon is in a range from about 50% to about 99%.

In some embodiments, the graphene may include hydrogen in a range from about 1 at % (atomic percent) to about 20 at %.

In some embodiments, the graphene may have a density in a range from about 1.6 g/cc to about 2.1 g/cc.

In some embodiments, the graphene may include crystals having a size in a range from about 0.5 nm to about 100 nm.

In some embodiments, a ratio of D peak to G peak of the Raman spectrum of the graphene may be 3 or less, a ratio of 2D peak to G peak may be 0.1 or more, and a half-width of D peak may be 50 $cm^{-1}$ or less.

In some embodiments, the liner layer may have an all-around shape surrounding the conductive wiring.

In some embodiments, the liner layer may partially cover the at least one surface of the conductive wiring.

In some embodiments, the liner layer may be on one side surface of the conductive wiring inside the trench.

In some embodiments, the liner layer may be on both side surfaces of the conductive wiring inside the trench.

In some embodiments, the liner layer may be on a lower surface of the conductive wiring inside the trench.

In some embodiments, the liner layer may be on both side surfaces of the conductive wiring and a lower surface of the conductive wiring inside the trench.

In some embodiments, the liner layer may be on one side surface of the conductive wiring and a lower surface of the conductive wiring inside the trench.

In some embodiments, the liner layer may be on an upper surface of the conductive wiring.

In some embodiments, the liner layer may be on one side surface of the conductive wiring and an upper surface of the conductive wiring inside the trench.

In some embodiments, the liner layer may be on an upper surface of the conductive wiring and a lower surface of the conductive wiring inside the trench.

In some embodiments, the liner layer may be on an upper surface of the conductive wiring, one side surface of the conductive wiring, and a lower surface of the conductive wiring inside the trench.

In some embodiments, the liner layer may include one of Cu, Mo, Ru, Al, Ti, Ta, W, Pt, Rh, Ir, Co, TiN, TaN, and Mn.

In some embodiments, a bonding force between the liner layer and the dielectric layer may be in a range of about 2.0 $J/m^2$ to about 10.0 $J/m^2$ or a bonding force between the liner layer and the conductive wiring may be in a range of about 2.0 $J/m^2$ to about 10.0 $J/m^2$.

According to an embodiment, an interconnect structure may include a dielectric layer including a trench and a region surrounding the trench of the dielectric layer, the region of the dielectric layer defining a sidewall of the trench and including a top surface higher than a bottom surface of the trench; a conductive wiring in the trench, the conductive wiring including graphene; and a liner layer including at least one of a first portion and a second portion, the first portion on a top surface of the conductive wiring, the second portion in the trench between the dielectric layer and the conductive wiring, and the liner layer including a metal.

In some embodiments, the first portion of the liner layer may directly contact the conductive wiring, the second portion of the liner layer may directly contact the conductive wiring, or both the first portion and the second portion of the liner layer may directly contact the conductive wiring.

In some embodiments, the liner layer may include the second portion in the trench between the dielectric layer and the conductive wiring, the sidewall of the trench may include a first sidewall and a second sidewall opposite the first sidewall, and the bottom surface of the trench may be connected to the first sidewall and the second sidewall. The liner layer may be on at least one of the first sidewall of the trench, the second sidewall of the trench, and the bottom surface of the trench.

In some embodiments, the liner layer may include the second portion in the trench between the dielectric layer and the conductive wiring, the sidewall of the trench may include a first sidewall and a second sidewall opposite the first sidewall, and the bottom surface of the trench may be connected to the first sidewall and the second sidewall. The liner layer may not be between the conductive wiring and one or two of the first sidewall of the trench, the second sidewall of the trench, and the bottom surface of the trench.

According to embodiment, an electronic device may include one of the interconnect structures described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
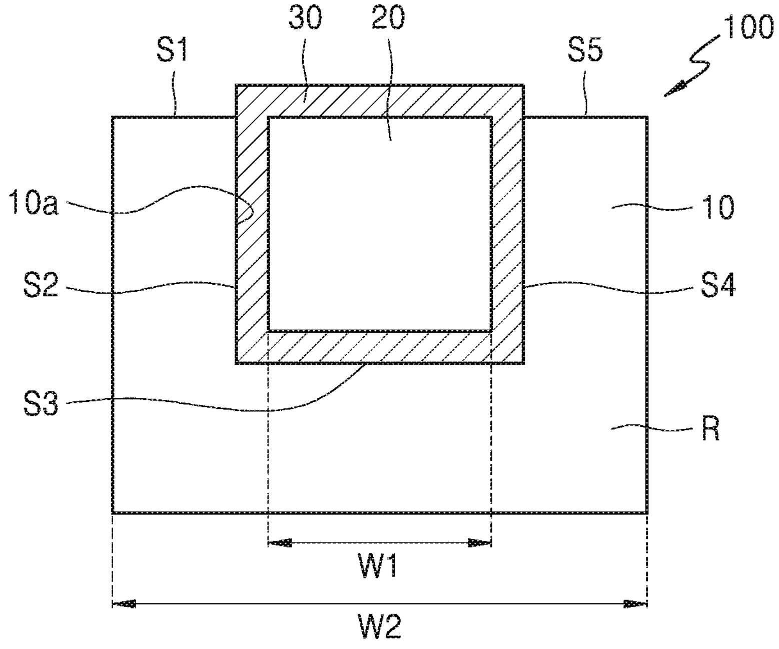
FIG. 1 is a schematic cross-sectional view of an interconnect structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In the drawings, the size of each component may be exaggerated for clarity and convenience of explanation. The embodiments of inventive concepts are capable of various modifications and may be embodied in many different forms.

When an element is referred to as "on" another element, it may include not only "directly on," "directly under" "directly on a left surface or right surface" in a contact manner, but also situations where intervening elements are present between the element and the other element (e.g., the element in a non-contact manner is on, under, at a left surface, or at a right surface of the other element). In contrast, when an element is referred to as being "directly on" or another element, there are no intervening elements present. Other words used to describe the relationship between elements or layers should be interpreted in a like fashion (e.g., "between" versus "directly between," "adjacent" versus "directly adjacent," "connected" versus "directly connected", "above" versus "directly above"). Singular expressions include plural expressions unless the context clearly indicates otherwise. When a part "comprises" or "includes" an element in the specification, unless otherwise defined, it is not excluding other elements but may further include other elements.

The term "above" and similar directional terms may be applied to both singular and plural.

Also, the connections of lines and connection members between constituent elements depicted in the drawings are examples of functional connection and/or physical or circuitry connections, and thus, in practical devices, may be expressed as replicable or additional functional connections, physical connections, or circuitry connections.

Figure 2:
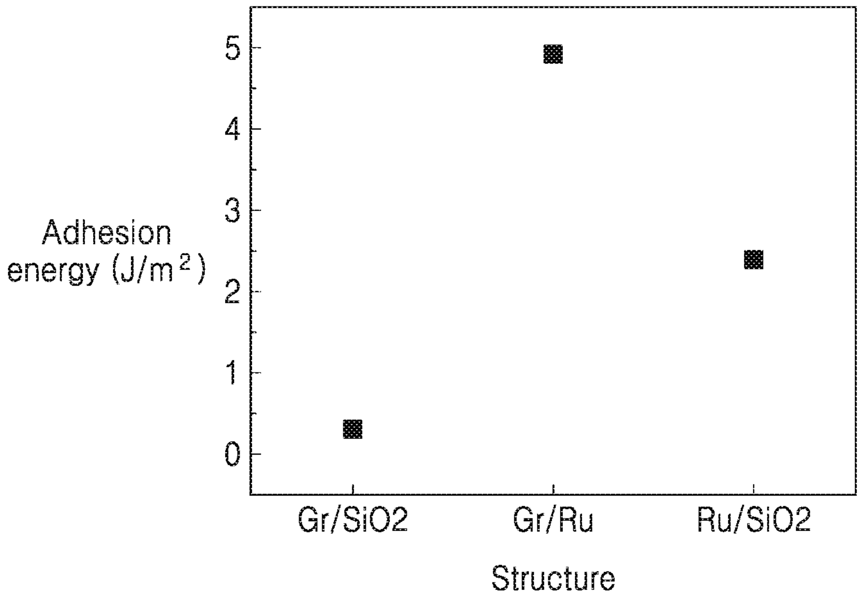
FIG. 2 is a graph showing comparisons of bonding forces between graphene and a dielectric, between graphene and a metal, and between a metal and a dielectric, respectively.
Figure 3:
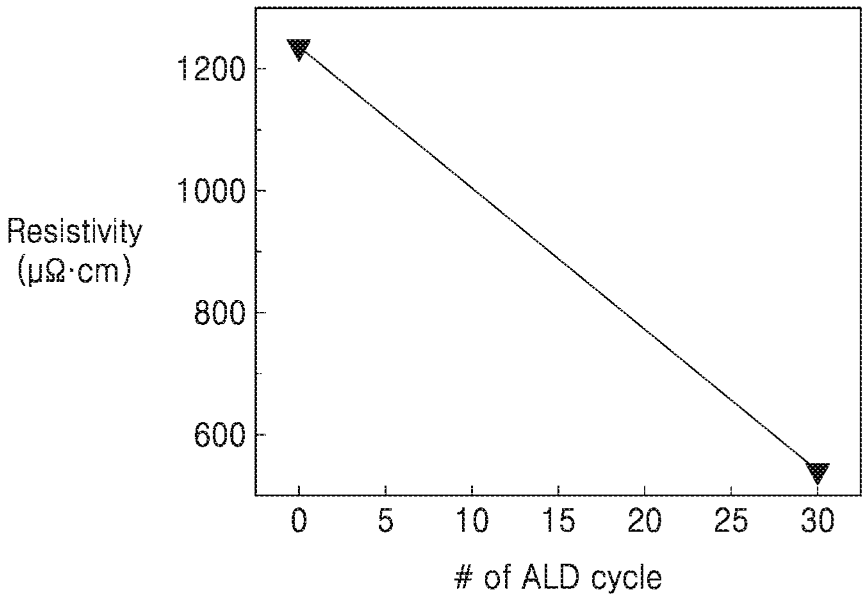
FIG. 3 is a graph schematically illustrating a change in a specific resistance of a conductive wiring as a process of forming a liner layer is repeated.

FIG. 1 is a schematic cross-sectional view of an interconnect structure 100 according to an embodiment. FIG. 2 is a graph showing comparisons of bonding forces between graphene and a dielectric, between graphene and a metal, and between a metal and a dielectric, respectively. FIG. 3 is a graph schematically illustrating a change in a specific resistance of a conductive wiring 20 as a process of forming a liner layer 30 is repeated.

Referring to FIG. 1, the interconnect structure 100 may include a dielectric layer 10, a conductive wiring 20, and a liner layer 30. The interconnect structure 100 may constitute an electronic device by being provided on a substrate (not shown). For example, the electronic device may include a DRAM or a logic device, and in this case, the interconnect structure may be applied to a Back End Of Line (BEOL) structure, such as a DRAM or a logic device. However, this is merely an example.

The substrate may include a semiconductor substrate. For example, the substrate may include a Group IV semiconductor material, a Group III-V semiconductor compound, or a Group II-VI semiconductor compound. As a specific example, the substrate may include Si, Ge, SiC, SiGe, SiGeC, Ge Alloy, GaAs, InAs, InP, or the like. However, this is only an example, and other various semiconductor materials may be used as the substrate.

The substrate may include, for example, a Silicon-On-Insulator (SOI) substrate or a Silicon Germanium-On-Insulator (SGOI) substrate. Further, the substrate may include a non-doped semiconductor material or a doped semiconductor material.

The substrate may include at least one semiconductor device (not shown). The semiconductor device may include, for example, at least one of a transistor, a capacitor, a diode, and a resistor. However, inventive concepts are not limited thereto.

The dielectric layer 10 is formed on the substrate. The dielectric layer 10 may have a single-layer structure or a multi-layer structure in which different materials from each other are stacked. The dielectric layer 10 may include a dielectric material used in a general semiconductor manufacturing process. For example, dielectric layer 10 may include a dielectric material having a dielectric constant of 3.6 or less. As a specific example, the dielectric layer 10 may include silicon oxide, nitride, silicon nitride, silicon carbide, silicate, or the like. However, this is merely examples and other various dielectric materials may be used as the dielectric layer 10. Also, the dielectric layer 10 may include an organic dielectric material.

A trench 10*a* having a desired and/or alternatively predetermined depth may be formed in the dielectric layer 10. The conductive wiring 20 may be provided to fill an inside of the trench 10*a*. The trench 10*a* may have a first width W1 and a region R of the dielectric layer 10 surrounding the trench 10*a* may have a second width W2. The second width W2 may be greater than the first width W1. The first dielectric layer 10, in the region R, may include a first surface S1, second surface S2, third surface S3, fourth surface S4, and fifth surface S5 defining the trench 10*a*. The first surface S1 and the fifth surface S5 may be an upper surface of the dielectric layer 10. The second surface S2, third surface S3, and fourth surface S4 may define a first sidewall, bottom surface, and second sidewall of the trench 10*a*, but example embodiments are not limited thereto.

The conductive wiring 20 may include a conductive material. For example, the conductive wiring 20 may include graphene. Here, the graphene included in the conductive wiring 20 may include intrinsic graphene or nanocrystalline graphene.

Intrinsic graphene is crystalline graphene and may include crystals greater than 100 nm. In addition, the nanocrystalline graphene may include crystals having a size less than that of intrinsic graphene. For example, nanocrystalline graphene may include crystals having a size in a range from about 0.5 nm to about 100 nm.

In intrinsic graphene, a ratio of carbon having a $sp^2$ bonding structure to the total carbon measured through X-ray photoelectron spectroscopy (XPS) analysis may be almost 100%. Intrinsic graphene may include little or no hydrogen. The density of intrinsic graphene may be, for example, about 2.1 g/cc.

In nanocrystalline graphene, a ratio of carbon having a $sp^2$ bond structure to the total carbon may be, for example, in a range of about 50% to about 99%. And, the nanocrystalline graphene may include hydrogen, for example, in a range from about 1 at % to about 20 at % (atomic percent). In addition, the density of the nanocrystalline graphene may be, for example, in a range from about 1.6 g/cc to about 2.1 g/cc.

The D peak on the Raman spectrum of graphene exists in the vicinity of 1350 $cm^{-1}$ and is a peak related to defects. A full width at half maximum (FWHM) of the D peak is related to a crystal size of graphene, and the greater the domain size, the smaller the full width at half maximum of the D peak. The 2D peak exists in the vicinity of 2700 $cm^{-1}$, and is a peak related to a graphene film quality. As the crystallinity is improved, the 2D peak may be stronger.

In the interconnect structure 100 according to the embodiment, the conductive wiring 20 includes graphene, and the graphene may be included, for example, nanocrystalline graphene. For example, the graphene of the conductive wiring 20 may be formed so that a ratio of D peak intensity to G peak intensity is, for example, about 3 or less, a ratio of 2D peak intensity to G peak intensity is, for example, about 0.1 or more, and, a half-width of the D peak may be, for example, about 50 $cm^{-1}$ or less, for example, in a range of about 25 $cm^{-1}$ to about 50 $cm^{-1}$.

The liner layer 30 may be provided in contact with at least one surface of the conductive wiring 20. For example, the liner layer 30 may have an all-around shape surrounding the conductive wiring 20. In this case, the liner layer 30 may be provided on an upper surface of the conductive wiring 20 outside the trench 10*a* and on both side surfaces and a lower surface of the conductive wiring 20 inside the trench 10*a*.

The liner layer 30 may be provided between the conductive wiring 20 and the dielectric layer 10 to improve adhesion between the conductive wiring 20 and the dielectric layer 10. Referring to FIG. 2, a bonding force between graphene that may be included in the conductive wiring 20 and $SiO_2$ included in the dielectric layer 10 may be about 0.3

J/m2. In addition, a bonding force between graphene and Ru that may be included in the liner layer 30 may be about 4.9 $J/m^2$, and a bonding force between Ru and $SiO_2$ may be about 2.4 $J/m^2$. As such, when the liner layer 30 including Ru is provided between the conductive wiring 20 including graphene and the dielectric layer 10 including $SiO_2$, the bonding force between the conductive wiring 20 and the dielectric layer 10 may be improved. However, inventive concepts are not limited thereto, and for example, the liner layer 30 may include any one of Cu, Mo, Ru, Al, Ti, Ta, W, Pt, Rh, Ir, Co, TiN, TaN, and Mn. The bonding force between the liner layer 30 and the dielectric layer 10 or the bonding force between the liner layer 30 and the conductive wiring 20 may be in a range of about 2.0 $J/m^2$ to about 10.0 $J/m^2$.

In addition, because the liner layer 30 including a metal is provided on at least one surface of the conductive wiring 20, the specific resistance of the conductive wiring 20 may be reduced. Referring to FIG. 3, as an atomic layer deposition (ALD) process for forming the liner layer 30 on the conductive wiring 20 is repeated, the specific resistance of the conductive wiring 20 may gradually decrease. The liner layer 30 including a metal having abundant free electrons may provide electrons (charge transfer) to the conductive wiring 20 including graphene, and accordingly, the specific resistance of the conductive wiring 20 may decrease.

For example, even when the conductive wiring 20 is formed under a low-temperature process of 400° C. or less, the specific resistance of the conductive wiring 20 may be maintained as low as 1000 μΩ·cm due to the liner layer 30 in contact with at least one surface of the conductive wiring 20. For example, the specific resistance of the conductive wiring 20 may be maintained as low as 100 μΩ·cm by the liner layer 30 in contact with at least one surface thereof.

In this way, due to the liner layer 30 formed to contact at least one surface of the conductive wiring 20 provided to fill the inside of the trench 10*a* of the dielectric layer 10, the bonding force between the conductive wiring 20 and the dielectric layer 10 may be improved, and at the same time, the specific resistance of the conductive wiring 20 may be reduced.

Figure 4:
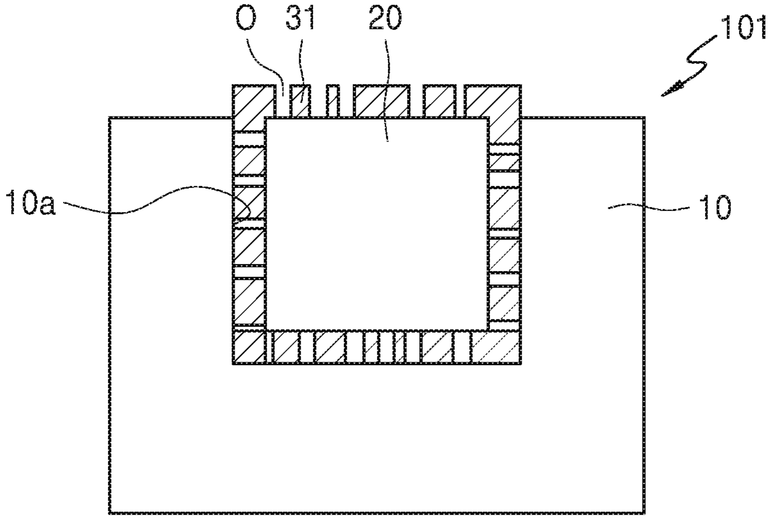
FIG. 4 is a cross-sectional view schematically illustrating an interconnect structure according to another embodiment.

FIG. 4 is a schematic cross-sectional view of an interconnect structure 101 according to another embodiment. The interconnect structure 101 of FIG. 4 may be substantially the same as the interconnect structure 100 of FIG. 1 except that the structure of a liner layer 31 is different from that of the liner layer 30 of FIG. 1. In the description of FIG. 4, descriptions previously given with reference to FIG. 1 will be omitted.

Referring to FIG. 4, the interconnect structure 101 may include a dielectric layer 10, a conductive wiring 20, and a liner layer 31. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 31 may be provided in contact with at least one surface of the conductive wiring 20. For example, the liner layer 31 may have an all-around shape surrounding the conductive wiring 20. In this case, the liner layer 31 may be provided on an upper surface of the conductive wiring 20 outside the trench 10*a* and on both side surfaces and a lower surface of the conductive wiring 20 inside the trench 10*a*.

At the same time, the liner layer 31 may be formed to partially cover at least one surface of the conductive wiring 20. The liner layer 31 may be formed to partially cover at least one of an upper surface of the conductive wiring 20 outside the trench 10*a* and both side surfaces and the lower surface of the conductive wiring 20 inside the trench 10*a*. In this case, the liner layer 31 may have a thickness of several nanometers or less. For example, the thickness of the liner layer 31 formed to partially cover at least one surface of the conductive wiring 20 may be 5 nm or less.

For example, the liner layer 31 may be formed to partially cover all the upper surface of the conductive wiring 20 outside the trench 10*a*, both side surfaces, and the lower surface of the conductive wiring 20 inside the trench 10*a*. However, inventive concepts are not limited thereto, and unlike that shown in FIG. 4, the liner layer 31 may be formed to partially cover any one surface, any two surfaces, or any three surfaces from among the upper surface of the conductive wiring 20 outside the trench 10*a* and both side surfaces and the lower surface of the conductive wiring 20 inside the trench 10*a*. The liner layer 31 may include one or more openings 0 exposing a surface of the conductive wiring 20.

Figure 5:
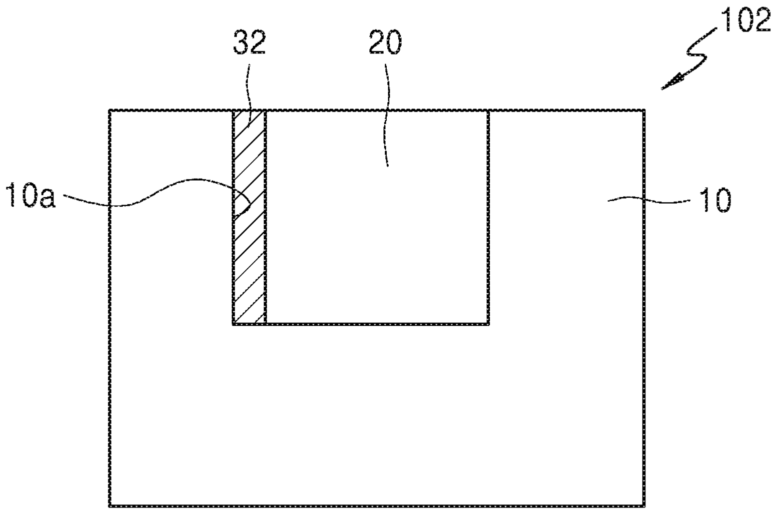
FIG. 5 is a schematic cross-sectional view of an interconnect structure according to still another embodiment.
Figure 6:
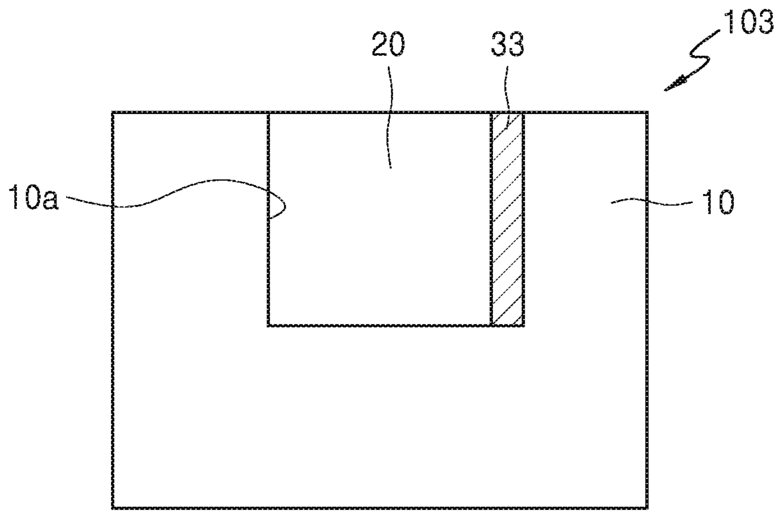
FIG. 6 is a schematic cross-sectional view of an interconnect structure according to still another embodiment.
Figure 7:
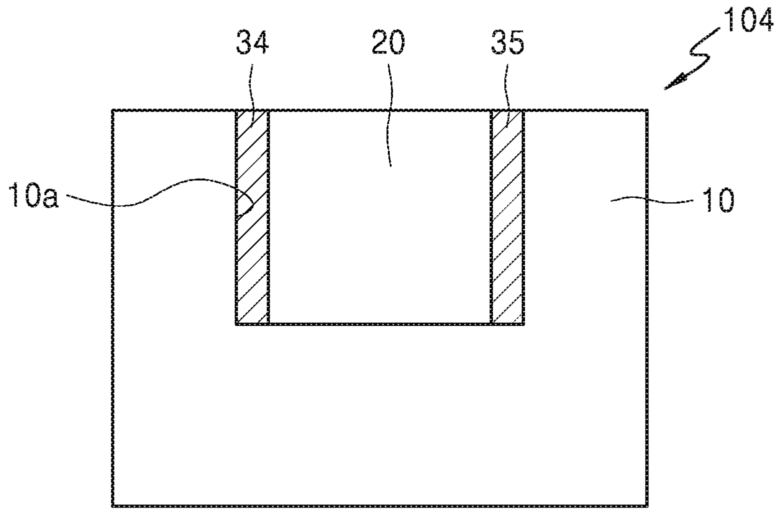
FIG. 7 is a cross-sectional view schematically illustrating an interconnect structure according to still another embodiment.
Figure 8:
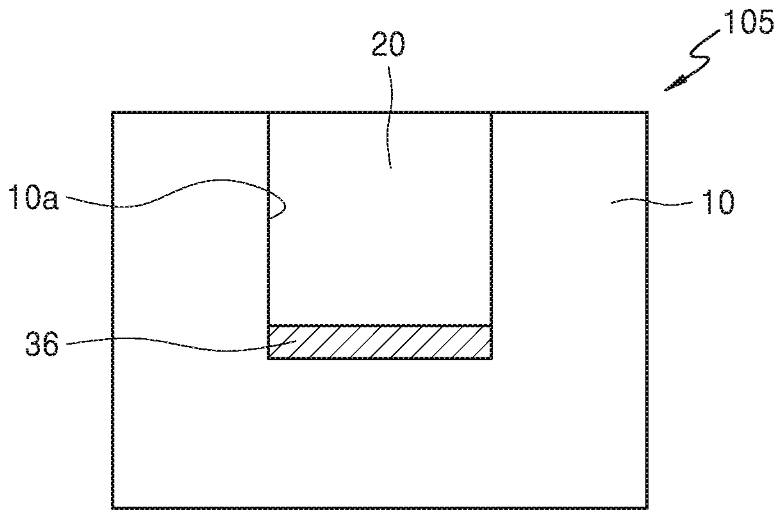
FIG. 8 is a schematic cross-sectional view illustrating an interconnect structure according to another embodiment.

FIG. 5 is a schematic cross-sectional view of an interconnect structure 102 according to still another embodiment; FIG. 6 is a schematic cross-sectional view of an interconnect structure 103 according to still another embodiment; FIG. 7 is a cross-sectional view schematically illustrating an interconnect structure 104 according to still another embodiment. FIG. 8 is a schematic cross-sectional view illustrating an interconnect structure 105 according to another embodiment;

The interconnect structures 102, 103, 104, and 105 of FIGS. 5 to 8 may be substantially the same as the interconnect structure 100 of FIG. 1 except that liner layers 32, 33, 34, 35 and 36 have different structures from the structure of the liner layer 30 of FIG. 1, respectively. In the description of FIGS. 5 to 8, descriptions previously given with reference to FIG. 1 will be omitted.

Referring to FIG. 5, the interconnect structure 102 may include a dielectric layer 10, a conductive wiring 20, and a liner layer 32. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 32 may be provided on one side surface of the conductive wiring 20. For example, the liner layer 32 may be provided to contact a left side surface of the conductive wiring 20 inside the trench 10*a*.

Referring to FIG. 6, the interconnect structure 103 may include a dielectric layer 10, a conductive wiring 20, and a liner layer 33. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 33 may be provided on one side surface of the conductive wiring 20. For example, the liner layer 33 may be provided to contact a right side surface of the conductive wiring 20 inside the trench 10*a*.

Referring to FIG. 7, the interconnect structure 104 may include a dielectric layer 10, a conductive wiring 20, and liner layers 34 and 35. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layers 34 and 35 may be provided on both sides of the conductive wiring 20. For example, the liner layers 34 and 35 may be provided to contact both sides of the conductive wiring 20 inside the trench 10*a*. In this case, the first liner layer 34 may be provided on a left side of the conductive wiring 20 inside the trench 10*a*, and the second liner layer 35 may be provided on a right side of the conductive wiring 20 inside the trench 10*a*.

Referring to FIG. 8, the interconnect structure 105 may include a dielectric layer 10, a conductive wiring 20, and a liner layer 36. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 36 may be provided on a lower surface of the conductive wiring 20. For example, the liner layer 36 may be provided to contact the lower surface of the conductive wiring 20 inside the trench 10*a*.

Figure 9:
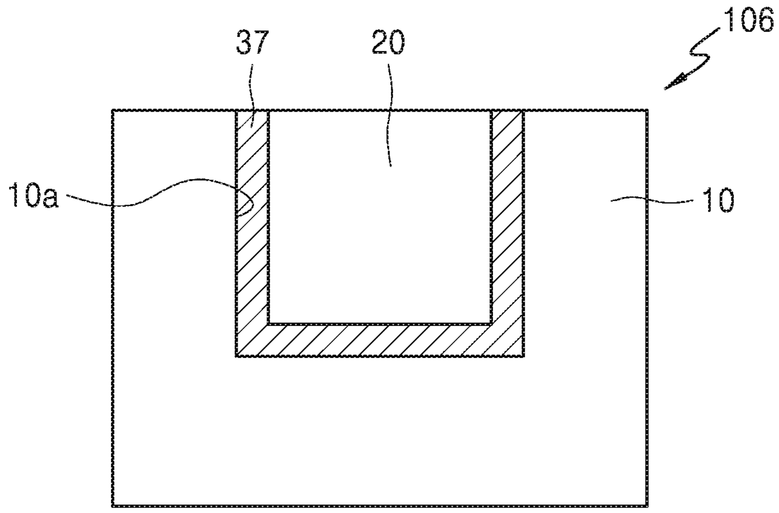
FIG. 9 is a schematic cross-sectional view illustrating an interconnect structure according to still another embodiment.
Figure 10:
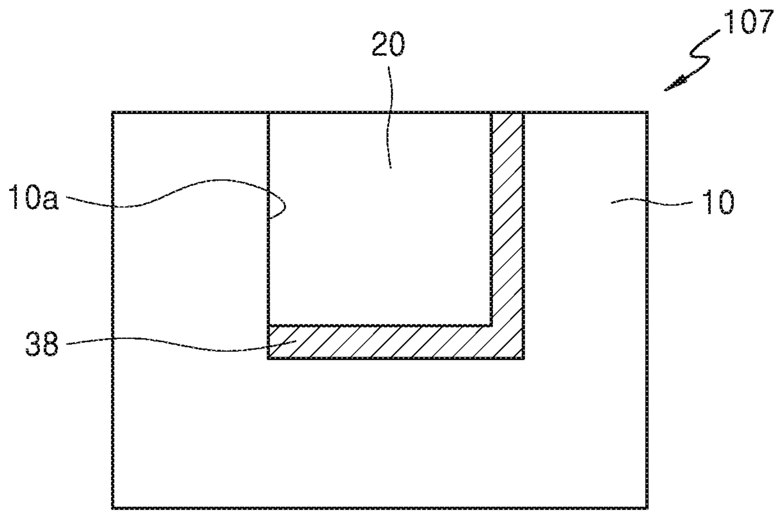
FIG. 10 is a schematic cross-sectional view illustrating an interconnect structure according to still another embodiment.
Figure 11:
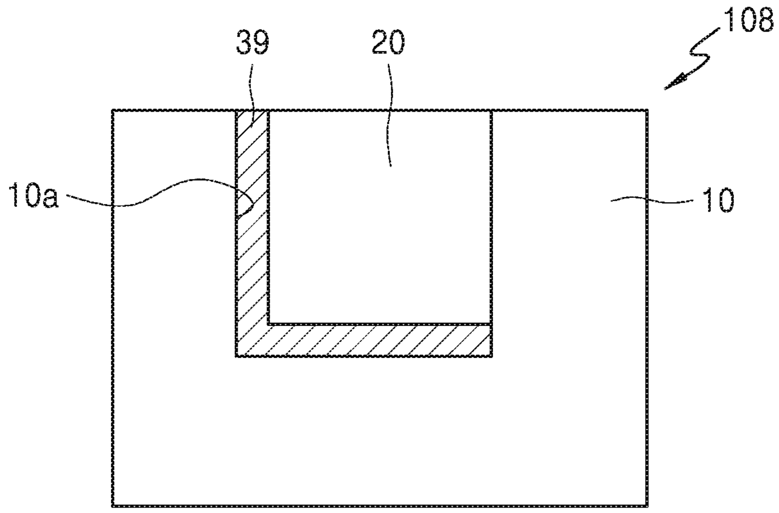
FIG. 11 is a schematic cross-sectional view illustrating an interconnect structure according to still another embodiment.

FIG. 9 is a schematic cross-sectional view illustrating an interconnect structure 106 according to still another embodiment; FIG. 10 is a schematic cross-sectional view illustrating an interconnect structure 107 according to still another embodiment; FIG. 11 is a schematic cross-sectional view illustrating an interconnect structure 108 according to still another embodiment;

The interconnect structures 106, 107, and 108 of FIGS. 9 to 11 may be substantially the same as the interconnect structure 100 of FIG. 1 except that structures of the liner layers 37, 38, and 39 are different from the structure of the liner layer 30 of FIG. 1, respectively. In the description of FIGS. 9 to 11, descriptions previously given with reference to FIG. 1 will be omitted.

Referring to FIG. 9, the interconnect structure 106 may include a dielectric layer 10, a conductive wiring 20, and a liner layer 37. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 37 may be provided on both side surfaces and a lower surface of the conductive wiring 20. For example, the liner layer 37 may be provided to contact both side surfaces and the lower surface of the conductive wiring 20 inside the trench 10*a*.

Referring to FIG. 10, the interconnect structure 107 may include a dielectric layer 10, a conductive wiring 20, and a liner layer 38. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 38 may be provided on one side surface and a lower surface of the conductive wiring 20. For example, the liner layer 38 may be provided to contact a right side and lower surfaces of the conductive wiring 20 inside the trench 10*a*.

Referring to FIG. 11, the interconnect structure 108 may include a dielectric layer 10, a conductive wiring 20, and a liner layer 39. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 39 may be provided on one side surface and a lower surface of the conductive wiring 20. For example, the liner layer 39 may be provided to contact a left side surface and a lower surface of the conductive wiring 20 inside the trench 10*a*.

Figure 12:
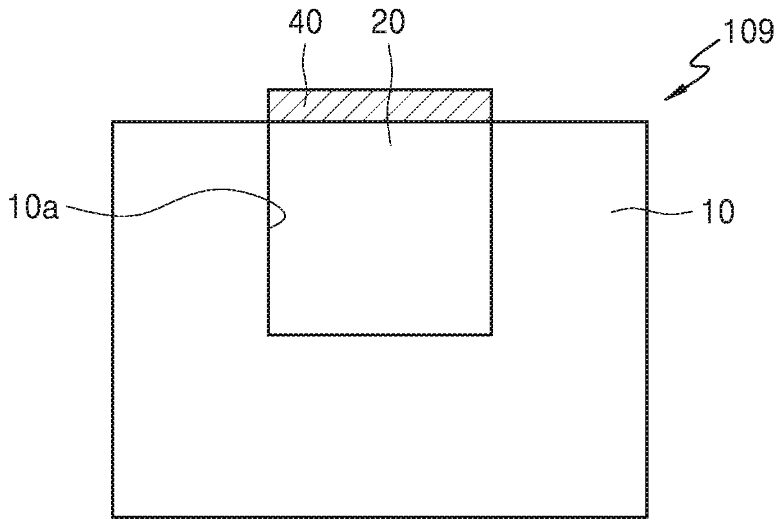
FIG. 12 is a schematic cross-sectional view illustrating an interconnect structure according to another embodiment.
Figure 13:
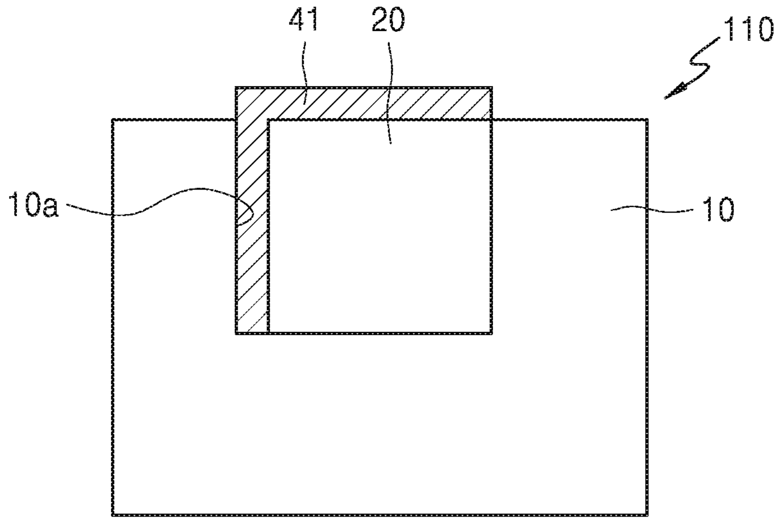
FIG. 13 is a schematic cross-sectional view illustrating an interconnect structure according to still another embodiment.
Figure 14:
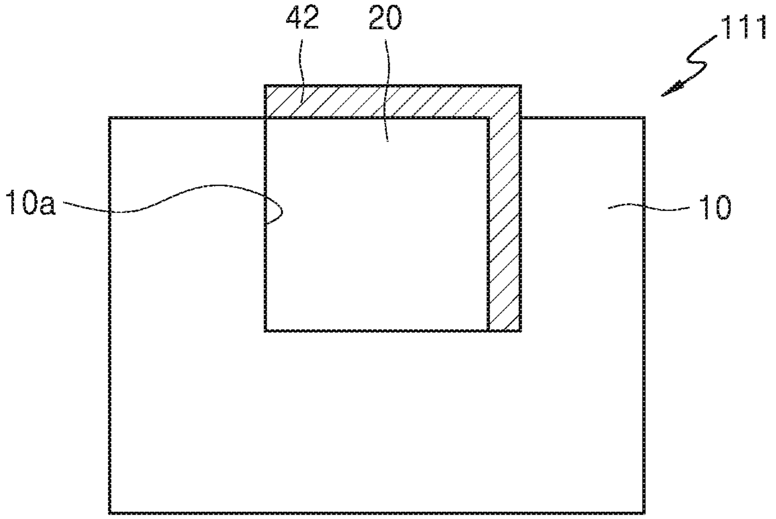
FIG. 14 is a schematic cross-sectional view illustrating an interconnect structure according to another embodiment.

FIG. 12 is a schematic cross-sectional view of an interconnect structure 109 according to another embodiment. FIG. 13 is a schematic cross-sectional view illustrating an interconnect structure 110 according to another embodiment. FIG. 14 is a schematic cross-sectional view illustrating an interconnect structure 111 according to another embodiment. 15 is a schematic cross-sectional view illustrating an interconnect structure 112 according to another embodiment.

The interconnect structures 109, 110, 111, and 112 of FIGS. 12 to 15 may be substantially the same as the interconnect structure 100 of FIG. 1 except that structures of liner layers 40, 41, 42, 43, and 44 are different from the structure of the liner layer 30 of FIG. 1, respectively. In the description of FIGS. 12 to 15, descriptions previously given with reference to FIG. 1 will be omitted.

Referring to FIG. 12, the interconnect structure 109 may include a dielectric layer 10, a conductive wiring 20, and a liner layer 40. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 40 may be provided on an upper surface of the conductive wiring 20. For example, the liner layer 40 may be provided outside the trench 10*a* to contact the upper surface of the conductive wiring 20.

Referring to FIG. 13, the interconnect structure 110 may include a dielectric layer 10, a conductive wiring 20, and a liner layer 41. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 41 may be provided on one side surface and an upper surface of the conductive wiring 20. For example, the liner layer 41 may be provided to contact a left side surface of the conductive pattern 20 inside the trench 10*a* and to contact the upper surface of the conductive wiring 20 outside the trench 10*a*.

Referring to FIG. 14, the interconnect structure 111 may include a dielectric layer 10, a conductive wiring 20, and a liner layer 42. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 42 may be provided on one side surface and an upper surface of the conductive wiring 20. For example, the liner layer 42 may be provided to contact a right side surface of the conductive pattern 20 inside the trench 10*a* and to contact the upper surface of the conductive wiring 20 outside the trench 10*a*.

Figure 15:
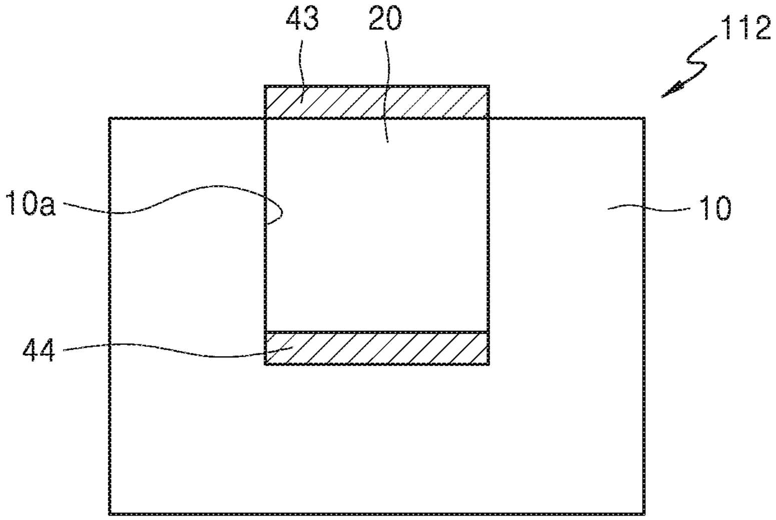
FIG. 15 is a schematic cross-sectional view illustrating an interconnect structure according to still another embodiment.

Referring to FIG. 15, the interconnect structure 112 may include a dielectric layer 10, a conductive wiring 20, and first and second liner layers 43 and 44. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The first and second liner layers 43 and 44 may be provided on upper and lower surfaces of the conductive wiring 20, respectively. For example, the first liner layer 43 may be provided to contact the upper surface of the conductive pattern 20 from the outside of the trench 10*a*, and the second liner layer 44 may be provided to contact the lower surface of the conductive wiring 20 in an inside of the trench 10*a*.

Figure 16:
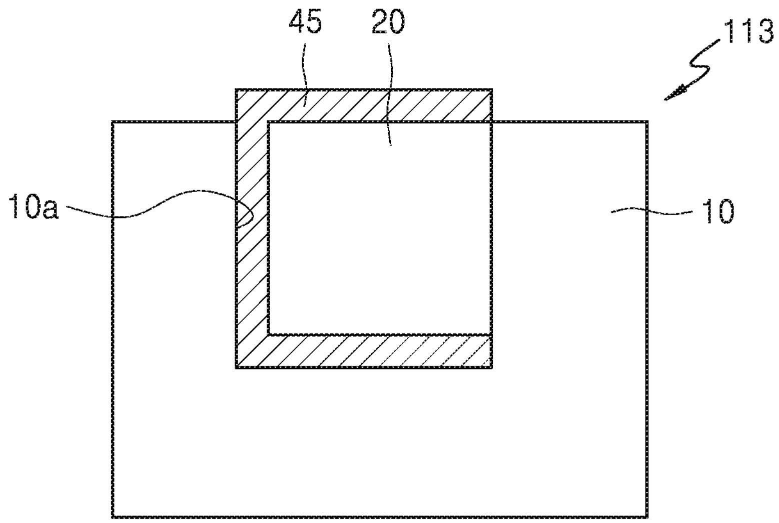
FIG. 16 is a schematic cross-sectional view illustrating an interconnect structure according to still another embodiment.
Figure 17:
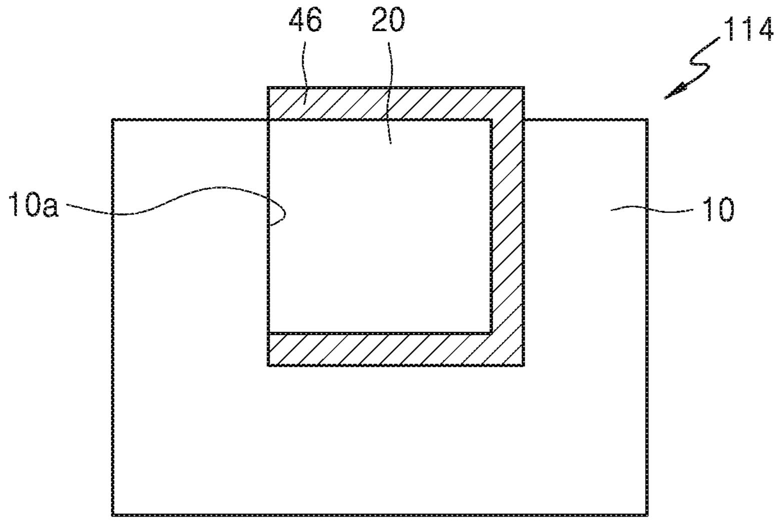
FIG. 17 is a schematic cross-sectional view illustrating an interconnect structure according to still another embodiment.

FIG. 16 is a schematic cross-sectional view illustrating an interconnect structure 113 according to another embodiment. FIG. 17 is a schematic cross-sectional view illustrating an interconnect structure 114 according to another embodiment.

The interconnect structures 113 and 114 of FIGS. 16-17 may be substantially the same as the interconnect structures of FIG. 1 except that structures of liner layers 45 and 46 are different from the structure of the liner layer 30 of FIG. 1, respectively. In the description of FIGS. 16 to 17, descriptions previously given with reference to FIG. 1 will be omitted.

Referring to FIG. 16, the interconnect structure 113 may include a dielectric layer 10, a conductive wiring 20, and a liner layer 45. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 45 may be provided on an upper surface, one side surface, and a lower surface of the conductive wiring 20. For example, the liner layer 45 may be provided to contact the upper surface of the conductive wiring 20 from the outside of the trench 10*a* and to contact a left side surface and a lower surface of the conductive wiring 20 inside the trench 10*a*.

Referring to FIG. 17, the interconnect structure 114 may include a dielectric layer 10, a conductive wiring 20, and a liner layer 46. A trench 10*a* having a desired and/or alternatively predetermined depth may be formed in the dielectric layer 10. The conductive wiring 20 may be provided to fill an inside of the trench 10*a*. The conductive wiring 20 may include a conductive material. For example, the conductive wiring 20 may include graphene.

The liner layer 46 may be provided on an upper surface, one side surface, and the lower surface of the conductive wiring 20. For example, the liner layer 46 may be provided to contact the upper surface of the conductive wiring 20 from the outside of the trench 10*a* and to contact a right side surface and the lower surface of the conductive wiring 20 inside the trench 10*a*.

According to various embodiments of the present disclosure, an interconnect structure including a liner layer provided in contact with at least one surface of a conductive wiring and an electronic device including the interconnect structure may be provided.

According to various embodiments of the present disclosure, the liner layer provided in contact with at least one surface of the conductive wiring may allow a conductive wiring to have sufficiently low specific resistance to be used as an electronic device even under a low-temperature process.

While FIGS. 5 to 17 illustrate interconnect structures 102 to 114 including liner layers 32 to 46 fully covering one or more surfaces of the conductive wiring 20, example embodiments are not limited thereto. The liner layers 32 to 46 may be modified to have a structure like the liner layer 31 in FIG. 4, in which case the liner layers 32 to 46 would partially cover the corresponding surfaces of the conductive wiring 20 that are in contact with the liner layers 32 to 46. In other words, the liner layers 32 to 46 in FIGS. 5 to 17 could be modified to include one or more openings O like the liner layer 31 in FIG. 4.

The interconnect structure described above and the electronic device including the same have been described with reference to the embodiments shown in the drawings, but these are merely illustrative, and it should be understood by those skilled in the art that various modifications and equivalent other embodiments are possible. The embodiments should be considered in descriptive sense only and not for purposes of limitation. Therefore, the scope of inventive concepts is defined not by the detailed description of inventive concepts but by the appended claims, and all differences within the scope will be construed as being included in inventive concepts.

Figure 18A:
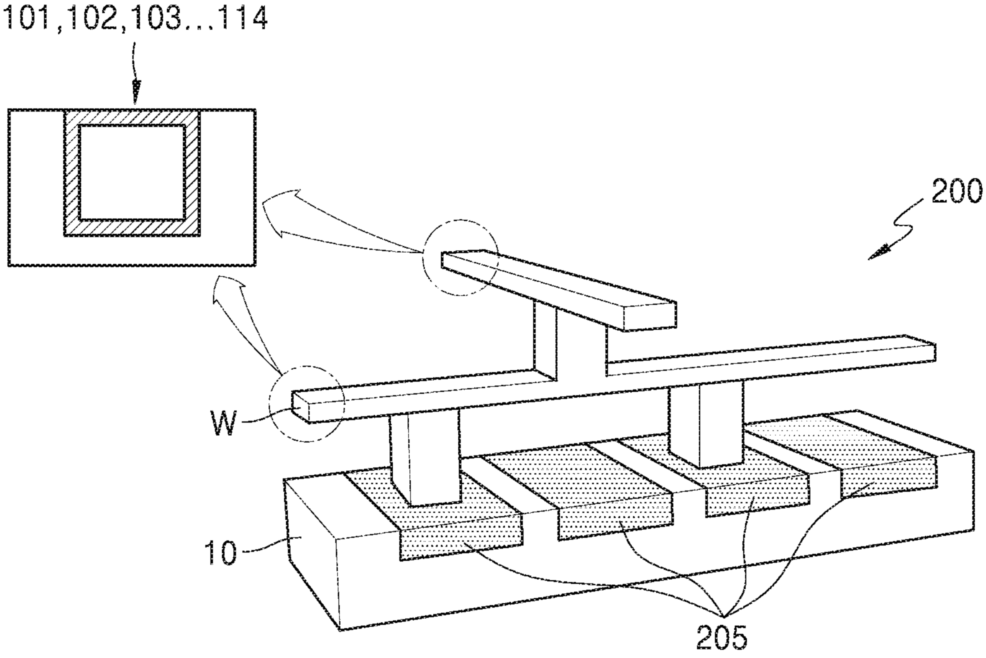
FIG. 18A is a conceptual view illustrating a semiconductor device including an interconnect structure according to an embodiment.
Figure 18B:
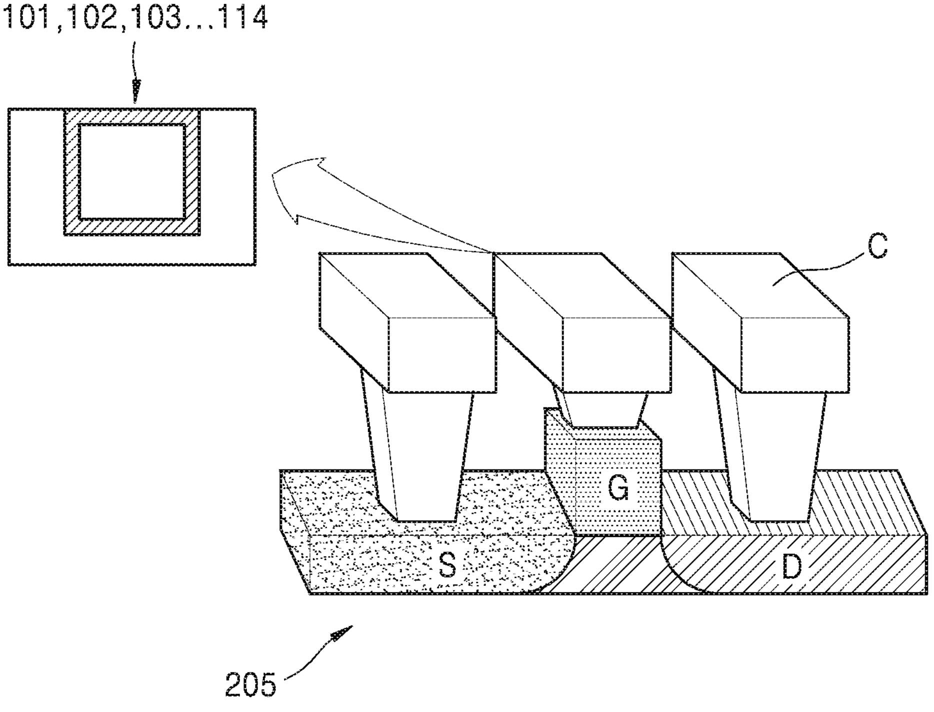
FIG. 18B is a conceptual view illustrating an interconnect structure connected to a transistor according to an embodiment.

For example, FIG. 18A is a conceptual view illustrating a semiconductor device 200 including an interconnect structure according to an example embodiment. FIG. 18B is a conceptual view illustrating that the interconnect structure is connected to a transistor according to an example embodiment.

Referring to FIG. 18A, according to an example embodiment, the semiconductor device 200 may include a wiring W. The wiring W may include one of the interconnect structures 101 to 114 described above in FIGS. 1 and 4 to 17. The wiring W may be connected to a device element 205, such as a DRAM element, a transistor, a logic element including a transistor, a resistor, a capacitor, a diode. As shown in FIG. 18B, in one embodiment, the device element 805 may be a transistor including a source S, gate G, and drain D. One of the interconnect structures 101 to 114 described above may be connected to the gate G. The drain D may be connected to a capacitor C, or other storage element, to provide a memory cell including the transistor and capacitor C or other storage element. In some embodiments, one of the interconnect structures 101 to 114 described above in FIGS. 1 and 4 to 17 may be connected to the source S and/or drain D.

Figure 19:
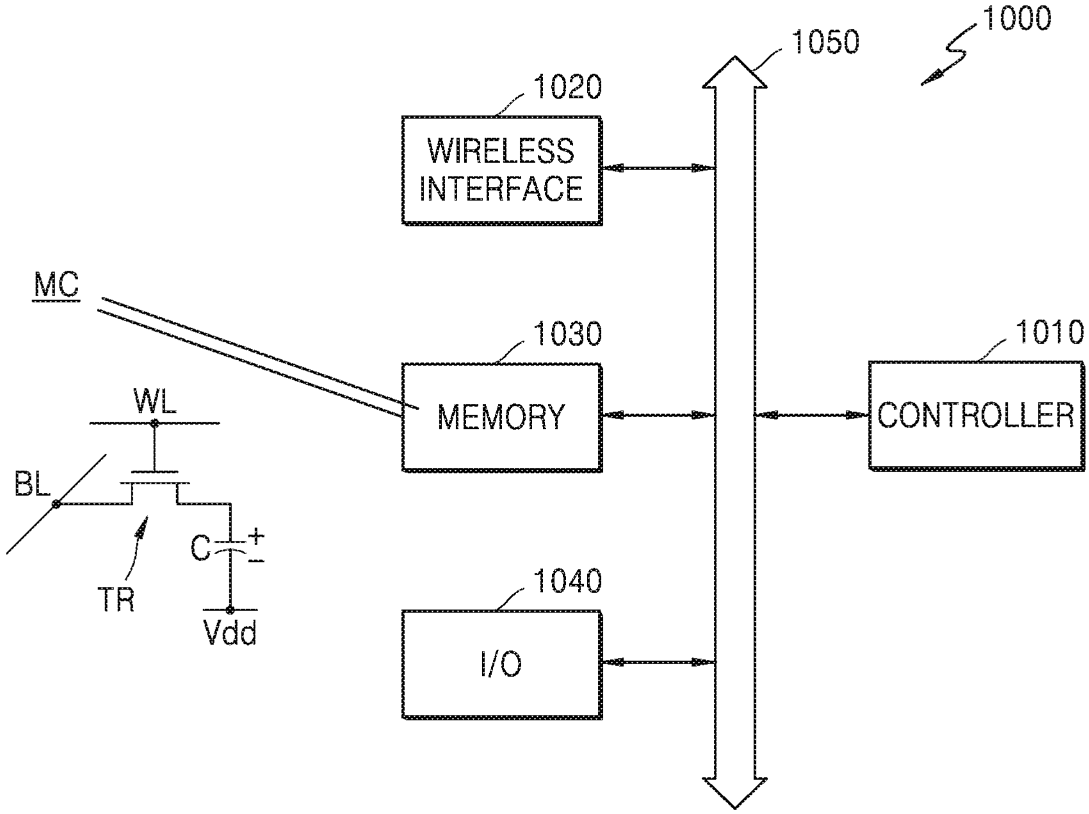
FIG. 19 is a block diagram of an electronic device according to an embodiment.

FIG. 19 is a block diagram of an electronic device according to an embodiment.

The electronic device 1000 may form a personal digital assistant (PDA), a laptop computer, a portable computer, a web tablet, a wireless phone, a mobile phone, a digital music player, a cable/wireless electronic device, etc., but is not limited thereto. The electronic device 1000 may include a controller 1010, an input/output device (I/O) 1020, a memory 1030, and a wireless interface 1040, which are connected to each other through a bus 1050.

The controller 1010 may include at least one selected from the group consisting of a microprocessor, a digital signal processor, and a processing device similar thereto. User's commands may be input through the I/O device 1020 for the controller 1010, and the I/O device 1020 may include at least one selected from the group consisting of a keypad, a keyboard, and a display. The memory 1030 may be used to store instructions executed by controller 1010 and/or store data. For example, the memory 1030 may be used to store user data. The electronic device 1000 may use the wireless interface 1040 to transmit/receive data through a wireless communication network. The wireless interface 1040 may include an antenna and/or a wireless transceiver. In some embodiments, the electronic device 1000 may be used for communication interface protocols (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The electronic device 1000 may include at one of the interconnect structures 101 to 114 described above.

The memory device 1030 includes a plurality of memory cells MC. Each of the memory cells MC may include a capacitor C connected to a transistor TR. A word line WL may be connected to a gate of the transistor TR. A bit line BL may be connected one source/drain region of the transistor TR and the capacitor C may be connected to the other source/drain region of the transistor TR. The other end of the capacitor C may be connected to a power supply voltage Vdd. The memory cell MC may include the device element 205 described above in FIG. 18B.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU) , an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An interconnect structure comprising:

a dielectric layer including a trench;

a conductive wiring disposed in the trench, the conductive wiring including graphene; and a liner layer contacting at least one surface of the conductive wiring, the liner layer including a metal, wherein a width of the trench in a first direction through the graphene of the conductive wiring is equal to a sum of a width of a first portion of the liner layer, a width of the graphene in the conductive wiring, and a width of a second portion of the liner layer, the first portion of the liner layer and the second portion of the liner layer are on opposite sides of the conductive wiring, and the width of the graphene in the conductive wiring corresponds to a thickness of the graphene in the first direction.

2. The interconnect structure of claim 1, wherein the graphene includes intrinsic graphene or nanocrystalline graphene.

3. The interconnect structure of claim 1, wherein the graphene has a bonding structure in which a ratio of carbon having a $sp^2$ bonding structure is in a range from about 50% to about 99%.

4. The interconnect structure of claim 1, wherein the graphene includes hydrogen in a range from about 1 at % (atomic percent) to about 20 at %.

5. The interconnect structure of claim 1, wherein the graphene has a density in a range from about 1.6 g/cc to about 2.1 g/cc.

6. The interconnect structure of claim 1, wherein the graphene includes crystals having a size in a range from about 0.5 nm to about 100 nm.

7. The interconnect structure of claim 1, wherein a ratio of D peak to G peak of a Raman spectrum of the graphene is 3 or less, a ratio of 2D peak to G peak is 0.1 or more, and a half-width of D peak is 50 $cm^{-1}$ or less.

8. The interconnect structure of claim 1, wherein the liner layer has an all-around shape surrounding the conductive wiring.

9. The interconnect structure of claim 1, wherein the liner layer includes one of Cu, Mo, Ru, Al, Ti, Ta, W, Pt, Rh, Ir, Co, TiN, TaN, and Mn.

10. The interconnect structure of claim 1, wherein a bonding force between the liner layer and the dielectric layer is in a range of about 2.0 $J/m^2$ to about 10.0 $J/m^2$, or a bonding force between the liner layer and the conductive wiring is in a range of about 2.0 $J/m^2$ to about 10.0 $J/m^2$.

11. An electronic device comprising:

the interconnect structure of claim 1.

12. The interconnect structure of claim 1, wherein a third portion of the liner layer is on a top surface of the conductive wiring, and the second portion of the liner layer is in the trench between the dielectric layer and the conductive wiring.

13. The interconnect structure of claim 12, wherein the third portion of the liner layer directly contacts the conductive wiring, and the second portion of the liner layer directly contacts the conductive wiring.

14. The interconnect structure of claim 12, wherein a sidewall of the trench includes a first sidewall and a second sidewall opposite the first sidewall, a bottom surface of the trench is connected to the first sidewall and the second sidewall, the first portion of the liner layer is on the first sidewall of the trench, the second portion of the liner layer is on the second sidewall of the trench, and a fourth portion of the liner layer is on the bottom surface of the trench.

15. The interconnect structure of claim 1, wherein the liner layer includes the second portion in the trench between the dielectric layer and the conductive wiring, a sidewall of the trench includes a first sidewall and a second sidewall opposite the first sidewall, a bottom surface of the trench is connected to the first sidewall and the second sidewall, and the liner layer is not between the conductive wiring and the bottom surface of the trench.

16. The interconnect structure of claim 1, wherein the dielectric layer defines a first sidewall of the trench, a bottom surface of the trench, and a second sidewall of the trench, the bottom surface of the trench is connected to the first sidewall of the trench and the second sidewall of the trench, the first sidewall of the trench is spaced apart in the first direction from the second sidewall of the trench, and the liner layer defines one or more openings between the graphene of the conductive wiring and at least one of the first sidewall of the trench, the second sidewall of the trench, and the bottom surface of the trench.

17. The interconnect structure of claim 1, wherein the graphene of the conductive wiring is disposed at a central region of the trench in a cross-sectional view.

18. The interconnect structure of claim 17, wherein the dielectric layer defines a first sidewall of the trench, a bottom surface of the trench, and a second sidewall of the trench, the bottom surface of the trench is connected to the first sidewall of the trench and the second sidewall of the trench, the first sidewall of the trench is spaced apart in the first direction from the second sidewall of the trench, opposite surfaces of the first portion of the liner layer directly contact the first sidewall of the trench and a first one of the opposite sides of the conductive wiring, respectively, opposite surfaces of the second portion of the liner layer directly contact the second sidewall of the trench and a second one of the opposite sides of the conductive wiring, respectively, the central region of the trench is between the first portion of the liner layer and the second portion of the liner layer, and the graphene of the conductive wiring completely fills the central region of the trench.

* * * * *